(12) United States Patent
Kauschke et al.

(10) Patent No.: US 7,231,575 B2
(45) Date of Patent: Jun. 12, 2007

(54) APPARATUS FOR ITERATIVE HARD-DECISION FORWARD ERROR CORRECTION DECODING

(75) Inventors: Michael Kauschke, Braunschweig (DE); Carsten Poppinga, Dortmund (DE)

(73) Assignee: Intel Corporation, Santa Clara, CA (US)

( * ) Notice: Subject to any disclaimer, the term of this patent is extended or adjusted under 35 U.S.C. 154(b) by 492 days.

(21) Appl. No.: 10/113,488

(22) Filed: Apr. 1, 2002

(65) Prior Publication Data

US 2003/0188248 A1    Oct. 2, 2003

(51) Int. Cl.
*H03M 13/00* (2006.01)
*H03M 13/03* (2006.01)

(52) U.S. Cl. .................. 714/755; 714/794; 714/795

(58) Field of Classification Search ............... 714/755, 714/756, 794, 795; 375/262
See application file for complete search history.

(56) References Cited

U.S. PATENT DOCUMENTS

| | | | |
|---|---|---|---|
| 4,564,945 A | | 1/1986 | Glover et al. |
| 5,230,003 A | * | 7/1993 | Dent et al. .................. 714/794 |
| 5,392,299 A | | 2/1995 | Rhines et al. |
| 5,754,563 A | | 5/1998 | White |
| 5,812,601 A | * | 9/1998 | Schramm .................... 375/262 |
| 6,029,264 A | * | 2/2000 | Kobayashi et al. .......... 714/755 |
| 6,161,209 A | * | 12/2000 | Moher ......................... 714/780 |
| 6,189,123 B1 | * | 2/2001 | Anders Nystrom et al. 714/751 |
| 6,421,804 B1 | * | 7/2002 | Lee .............................. 714/755 |
| 6,581,178 B1 | * | 6/2003 | Kondo ......................... 714/758 |
| 6,622,277 B1 | * | 9/2003 | Ramanujam et al. ....... 714/755 |
| 2003/0188253 A1 | | 10/2003 | Kauschke et al. |

FOREIGN PATENT DOCUMENTS

EP  1 162 775 A2  12/2001
WO  WO 01/95503 A1  12/2001

OTHER PUBLICATIONS

Omar, A.S.; FEC techniques in submarine transmission systems, Optical Fiber Communication Conference and Exhibit, vol. 2, 2001, pp. TuF1-1-TuF1-3, vol. 2.*
Stephen B. Wicker, "Error Control Systems for Digital Communication and Storage" Prentice-Hall, 1995, pp. 116-121.*
Berroeux, A., "Near Optimum Error Correcting Coding and Decoding: Turbo Codes", IEEE Transactions on Communications, Oct. 1996, pp. 1261-1271.*

(Continued)

*Primary Examiner*—Joseph D. Torres
(74) *Attorney, Agent, or Firm*—Blakely, Sokoloff, Taylor & Zafman LLP (57) ABSTRACT

An apparatus for iterative hard-decision forward error correction decoding is described. The apparatus comprises a binary receiver to convert an optical signal to an electrical signal, the electrical signal having a set of information symbols and a set of redundancy symbols, the set of redundancy symbols generated by different forward error correction (FEC) encoding schemes, and a plurality of decoders coupled with the binary receiver and coupled together, each of the decoders to decode the set of information symbols with the set of redundancy symbols in accordance with the different FEC encoding schemes.

4 Claims, 12 Drawing Sheets

OTHER PUBLICATIONS

R. Pyndiah, A. Glavieux, A. Picart and S. Jacq, "Near optimum decoding of product codes" in Proceedings of IEEE Globecom '94, vol. 1/3, pp. 339-343, Nov.-Dec. 1994.*

Mizouchi T. et al, Transparent Multiplexer Featuring Super FEC For Optical Transport Networking, Suboptic. The International Convention On Undersea Communications, May 2001, pp. 484-487, XP001151604.

Argon C. et al, Turbo Product Codes For Performance Improvement Of Optical CDMA Systems, Globecom, Nov. 2001, vol. 3 of 6, pp. 1505-1509, IEEE Global Telecommunications Conference. San Antonio TX, IEEE New York US. XP001054830, ISBN 0-7803-7206-9.

Young Kim et al, An Optical CDMA Packet Network With Turbo Coding, 11th IEEE International Symposium On Personal Indoor And Mobile Radio, vol. 1., Sep. 2000, pp. 751-756, XP010520734.

Puc A. et al, Concatenated Fec Experiment Over 5000 KM Long Straight Line WDM Test Bed, OFC/IOOC: International Conference On Integrated Optics And Optical Fiber Communication, Feb. 1999, pp. THQ6-1-THQ6-4, San Diego CA, XP000967046, ISBN 0-7803-5430-3.

Kao M-S et al, A Product-Coded WDM Coding System, IEEE Transactions On Communications, IEEE Inc. New York US., Jan. 1996, vol. 44 No. 1, pp. 43-46, XP000549642, ISSN 0090-6778.

Agere Systems, TFEC0410G 40 Gbits/s Optical Networking Interface With Strong FEC and Digital Wrapper, 18 pages, Mar. 2001.

S. Keshav, An Engineering Approach to Computer Networking ATM Networks, the Internet, and the Telephone Network, Chapter 12: Error Control, pp. 390-391, Apr. 1997, Addison-Wesley Professional Computing Series.

Stojanovic, et al, Concatenated Three-Dimensional SPC Turbo Code for OPtical Transmission Systems, Telsiks, Yugoslavia, Sep. 2001.

Ait Sab, et al, Concatenated Forward Error Correction Schemes for Long-Haul DWDM Optical Transmission Systems, Nice, France, ECOC Sep. 26, 1999.

Ait Sab, et al, Block Turbo Code Performances for Long-Haul DWDM Optical Transmission Systems.

Office Action mailed May 31, 2006 for co-pending U.S. Appl. No. 10/113,190.

* cited by examiner

APPARATUS FOR ITERATIVE HARD-DECISION FORWARD ERROR CORRECTION DECODING

BACKGROUND OF THE INVENTION

1. Field of the Invention

The invention relates to the field of communications. More specifically, the invention relates to error correction in communications.

2. Background of the Invention

In communication networks, forward error correction (FEC) is used to protect transmitted information from impairments that occur while being transported in a transmission system. In the case of algebraic block codes (e.g. the Reed Solomon code), redundancy symbols are added to the information symbols before transmission of a block of symbols. A network element that receives the transmission can correct transmission errors as long as the number of corrupted symbols does not exceed a certain threshold given by the special construction of the code.

An alternative to algebraic coding is iterative coding. Iterative coding algorithms have been developed for correction of streams of transmitted information where scalar information representing the reliability of a received symbol of the stream of transmitted information is available. These iterative coding algorithms are also referred to as soft-decision algorithms.

However, soft-decision coding techniques generally do not apply in optical networks where high transmission rates interfere with the ability to generate reliability information for received symbols. Moreover, soft-decision coding algorithms tend to have relatively poor performance for streams of transmitted information with low probability of bit errors after correction, which occurs in optical networks.

BRIEF DESCRIPTION OF THE DRAWINGS

The invention may best be understood by referring to the following description and accompanying drawings that are used to illustrate embodiments of the invention. In the drawings.

DETAILED DESCRIPTION OF THE DRAWINGS

In the following description, numerous specific details are set forth to provide a thorough understanding of the invention. However, it is understood that the invention may be practiced without these specific details. In other instances, well-known circuits, structures and techniques have not been shown in detail in order not to obscure the invention.

Figure 1A:
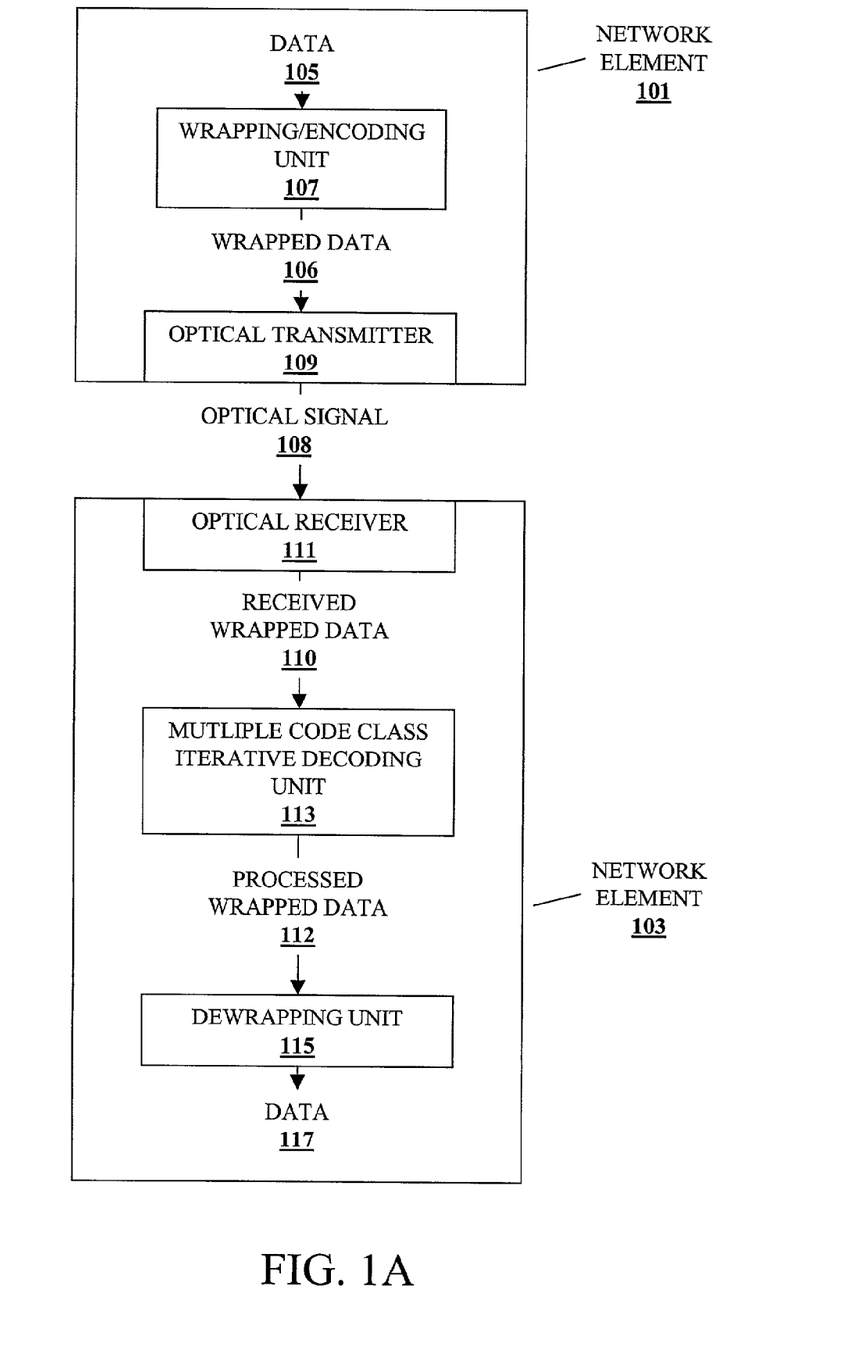
FIG. 1A is a diagram of exemplary network elements according to one embodiment of the invention.

FIG. 1A is a diagram of exemplary network elements according to one embodiment of the invention. In FIG. 1, a network element 101 is coupled with a network element 103. A wrapping/encoding unit 107, which will later be described in more detail herein, in the network element 101 receives data 105. The data includes a set of information symbols. One or more bits may represent each of the information symbols. The wrapping/encoding unit 107 adds overhead space to the data 105 (referred to as wrapping). The wrapping/encoding unit 107 initially fills part of the overhead space with administrative information. The administrative information may include patterns for code synchronization. The wrapping/encoding unit 107 then fills the remaining overhead space in the data 105 with redundancy symbols derived from the information symbols of the data 105. The redundancy symbols are members of interleaved code classes, which are later described in more detail herein. The wrapping/encoding unit 107 passes the wrapped data 106 to an optical transmitter 109. The optical transmitter 109 converts the wrapped data 106 from an electrical signal to an optical signal 108. The optical transmitter 109 then transmits the optical signal 108 from the network element 101 to the network element 103. In one embodiment of the invention, the wrapping/encoding unit 107 and the optical transmitter 109 are separate units. In an alternative embodiment of the invention, the wrapping/encoding unit 107 and the optical transmitter 109 are a single unit.

An optical receiver 111 in the network element 103 receives the optical signal 108. The optical receiver 111 converts the optical signal 108 into an electrical signal that is received wrapped data 110 and passes the received wrapped data 110 to a multiple code class iterative decoding unit 113. The received wrapped data 110 is the same as the wrapped data 106 if the wrapped data has not been impaired. For the purposes of this illustration, it is assumed that the received wrapped data 110 is the wrapped data 106 with impairments.

The multiple code class iterative decoding unit 113 processes the received wrapped data 110 with the added redundancy symbols to generate processed wrapped data 112. The multiple code class iterative decoding unit 113 passes the processed wrapped data 112 to a de-wrapping unit 115. The multiple code class iterative decoding unit 113 and the de-wrapping unit 115 will later be described in more detail herein.

The de-wrapping unit 115 removes the administrative information and overhead space formerly carrying the redundancy symbols from the processed wrapped data 112. The de-wrapping unit 115 then outputs data 117, which is identical to the original data 105, except for those locations in the data 117 with uncorrectable error constellations. The difference between the original data 105 and the output data 117 is referred to as output error rate. Various embodiments of the invention may implement the optical receiver 111, the multiple code class iterative decoding unit 113, and de-wrapping unit 115 differently. The optical receiver 111, the multiple code class iterative decoding unit 113, and de-wrapping unit 115 may be a single unit; the optical receiver 111 and the multiple code class iterative decoding unit 113 may be a single unit that is separate from the de-wrapping unit 115; or the multiple code class iterative decoding unit 113 and the de-wrapping unit 115 may be a single unit that is separate from the optical receiver 111.

Applying hard-decision FEC to optically transmitted data with interleaved code classes reduces output bit error rate.

Figure 1B:
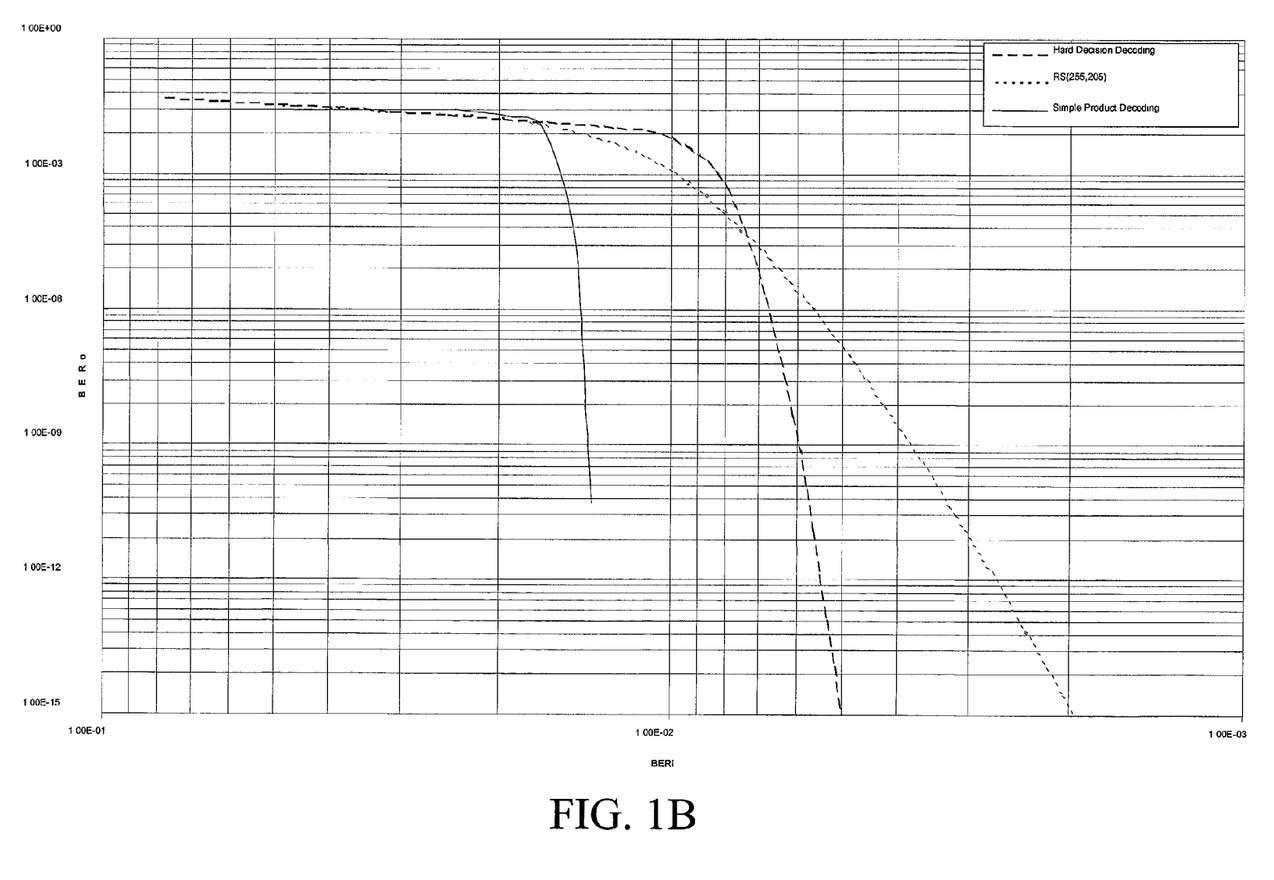
FIG. 1B illustrates input bit error rate (BERi) versus output bit error rate (BERo) with three exemplary encoding schemes with 25% of FEC related overhead added to the exemplary signals while transmitted according to one embodiment of the invention.

FIG. 1B illustrates input bit error rate (BERi) versus output bit error rate (BERo) with three exemplary encoding schemes with 25% of FEC related overhead added to the exemplary signals while transmitted according to one embodiment of the invention. The BERi is the probability of a single bit transmission error whereas the BERo is the probability of a single bit being corrupted after decoding a data based on an Averaged White Gaussian Noise model. The dotted line labeled "RS (255, 205)" illustrates the performance of a single stage Reed-Solomon encoding scheme. The dashed line labeled "Simple product decoding" illustrates the performance of a simple Reed-Solomon based block product encoding scheme with optimized code parameters. The solid line represents the performance of an encoding scheme implementing an iterative hard decision decoding of two interleaved code classes with two iterations. As illustrated in FIG. 1B, the encoding scheme that implements iterative hard-decision decoding of interleaved code classes outperforms the other exemplary encoding schemes at input BERs that typically occur in optical transmissions.

Figure 2:
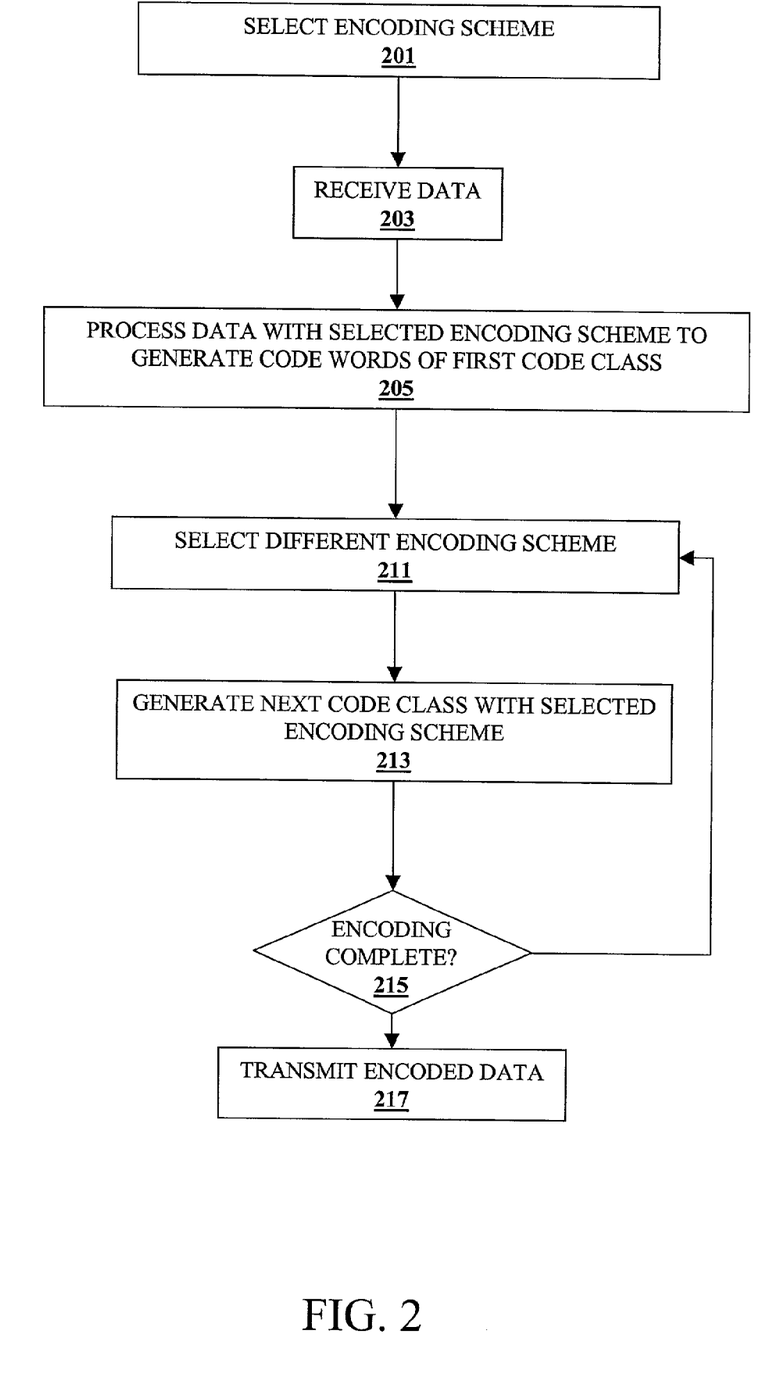
FIG. 2 is a an exemplary flowchart for encoding data according to one embodiment of the invention.

FIG. 2 is an exemplary flowchart for encoding data according to one embodiment of the invention. At block 201, an encoding scheme is selected. Selecting an encoding scheme includes selecting which forward error correction (FEC) encoding algorithm is to be used (e.g., BCH encoding, Reed-Solomon encoding, etc.) and selecting the parameters to be used with the encoding algorithm. In one embodiment of the invention, the set of parameters and procedures are predefined. In alternative embodiments of the invention, the parameters and encoding procedure are retrieved from memory, a user selects the parameters and the encoding procedure, the encoding procedure is selected at random from a set of encoding algorithms and each encoding algorithm has a predefined set of parameters, a set of parameters are selected from a predefined set of parameters at random to be used with a predefined encoding procedure, the parameters and/or the encoding procedure are selected from different parameters and/or encoding procedures stored on a wrapping/encoding unit and/or a separate storage unit, etc.

At block 203, data is received. At block 205, the data is processed with the selected encoding scheme to generate a set of code words (i.e., the data along with redundancy data) of a first code class. The term code class refers to all code words generated with a certain encoding procedure and a certain set of parameters. While in one embodiment of the invention different code classes are generated by the same encoding procedure using different parameters, in alternative embodiments of the invention, different code classes are generated by the same parameters and different encoding algorithms, or different encoding algorithms and different sets of parameters.

At block 211, a different encoding scheme is selected. The different encoding scheme is different in at least one aspect from the previously selected encoding scheme (e.g., different parameters, a different encoding algorithm, etc.).

At block 213, the next code class is generated by applying the selected encoding scheme to the encoded data processed at block 205. At block 215, it is determined if the encoding is complete. If the encoding is not complete, then control flows back to block 211. If the encoding is complete, then control flows to block 217.

At block 217, the encoded data is transmitted. The symbols of the data are encoded so that each symbol is a member of at least one code word of each code class.

While the flow diagrams in the Figures show a particular order of operations performed by certain embodiments of the invention, it should be understood that such order is exemplary (e.g., alternative embodiments of the invention may perform certain of the operations in a different order, combine certain of the operations, perform certain of the operations in parallel, etc.). For example, block 201 and/or block 211 may not be performed if the set of parameters are predetermined. In addition, block 203 may be performed before block 201. In another embodiment of the invention, block 201 and block 211 are performed sequentially or in parallel.

Figure 3A:
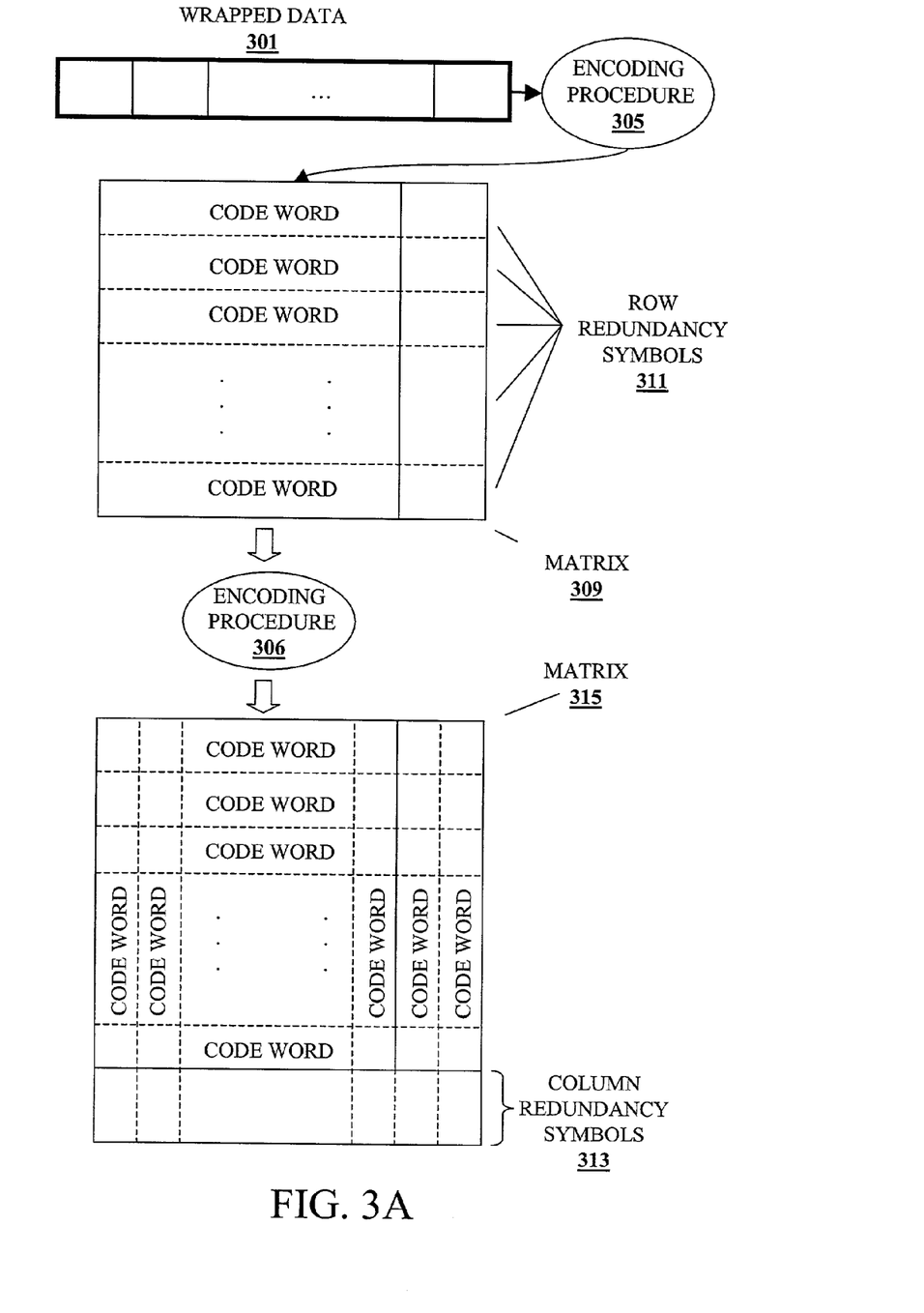
FIG. 3A is a diagram illustrating exemplary interleaving of two code classes in a matrix according to one embodiment of the invention.
Figure 3B:
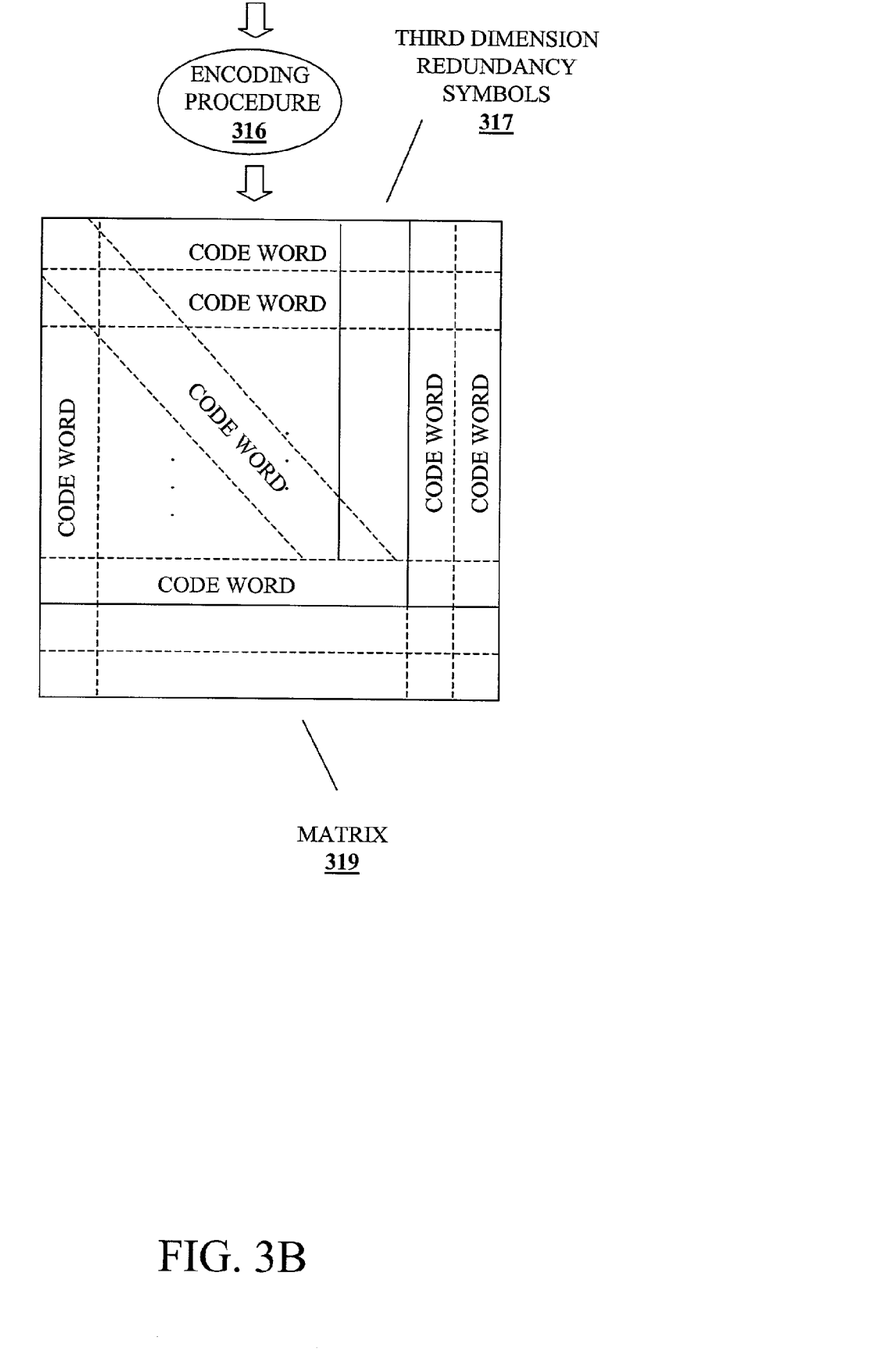
FIG. 3B is a diagram illustrating exemplary interleaving of a third code class into the matrix of FIG. 3A according to one embodiment of the invention.
Figure 3C:
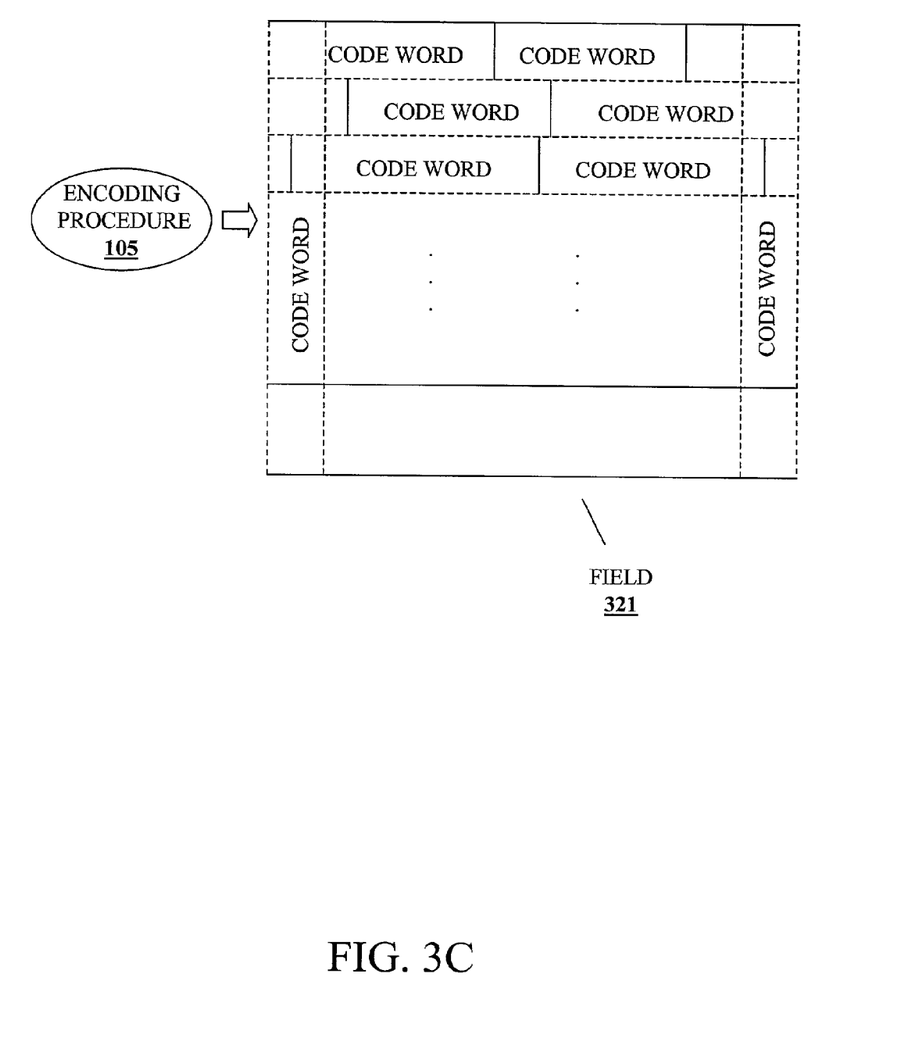
FIG. 3C is a diagram illustrating an alternative exemplary interleaving of two code classes according to one embodiment of the invention.

Encoding of symbols so that each symbol is a member of at least one code word of each code class may be illustrated with a matrix. FIGS. 3A–3C are diagrams illustrating interleaving of code classes.

FIG. 3A is a diagram illustrating exemplary interleaving of two code classes in a matrix according to one embodiment of the invention. In FIG. 3A, wrapped data 301 is processed by an encoding procedure 305. The encoding procedure 305 generates a first code class illustrated as a set of $k_2$ code words arranged as rows in a matrix 309. Each code word of the first code class includes $n_1$ symbols of which $k_1$ symbols are information symbols to be protected. The redundancy symbols for the first code class are illustrated in the matrix 309 as row redundancy symbols 311 ($n_1-k_1$ redundancy symbols for each row). The first code class corresponds to the first dimension of the matrix 309.

A second dimension of the matrix 309 is then processed by an encoding procedure 306. As previously stated, alternative embodiments of the invention may process the matrix 309 with another encoding procedure, with another encoding procedure and another set of parameters, etc. The encoding procedure 306 generates a matrix 315. The columns of the matrix 315 are the code words of the second code class. The code words of the second code class have a block length of $n_2$, $k_2$ information symbols, and $n_2-k_2$ redundancy symbols for each code word, which are illustrated as column redundancy symbols 313. The second code class includes $n_1$ code words (i.e., $n_1$ columns in the matrix 315). The second code class includes code words comprised of the row redundancy symbols 311 and redundancy symbols for correction of the row redundancy symbols 311.

FIG. 3B is a diagram illustrating exemplary interleaving of a third code class into the matrix of FIG. 3A according to one embodiment of the invention. In FIG. 3B, an encoding procedure 316 generates a matrix 319. The encoding procedure 319 encodes a third dimension of the matrix 306 to generate the matrix 319 with a third code class. The matrix 319 includes third dimension redundancy symbols 317. The third dimension redundancy symbols 317 correspond to each diagonal of the code words of the third code class.

FIG. 3C is a diagram illustrating an alternative exemplary interleaving of two code classes according to one embodiment of the invention. FIG. 3C illustrates the encoding procedure 105 generating a stream of interleaved code classes as a two-dimensional field 321. Field 321 includes row code words and column code words. Unlike the matrix 315 of FIG. 3A, the field 321 includes multiple code words in each row. In the field 321, the code words of the first code class do not align against a single code word of the second code class.

Interleaving multiple code classes provides for improved forward error correction. Each single FEC encoding scheme imposes hard restrictions on the transmission error distribution, like a fixed error limit per code word. Interleaving multiple code classes enables iterative decoding to widely overcome this limitation of FEC encoding schemes, resulting in drastically improved performance, especially for Averaged White Gaussian Noise (AWGN) models.

Figure 4:
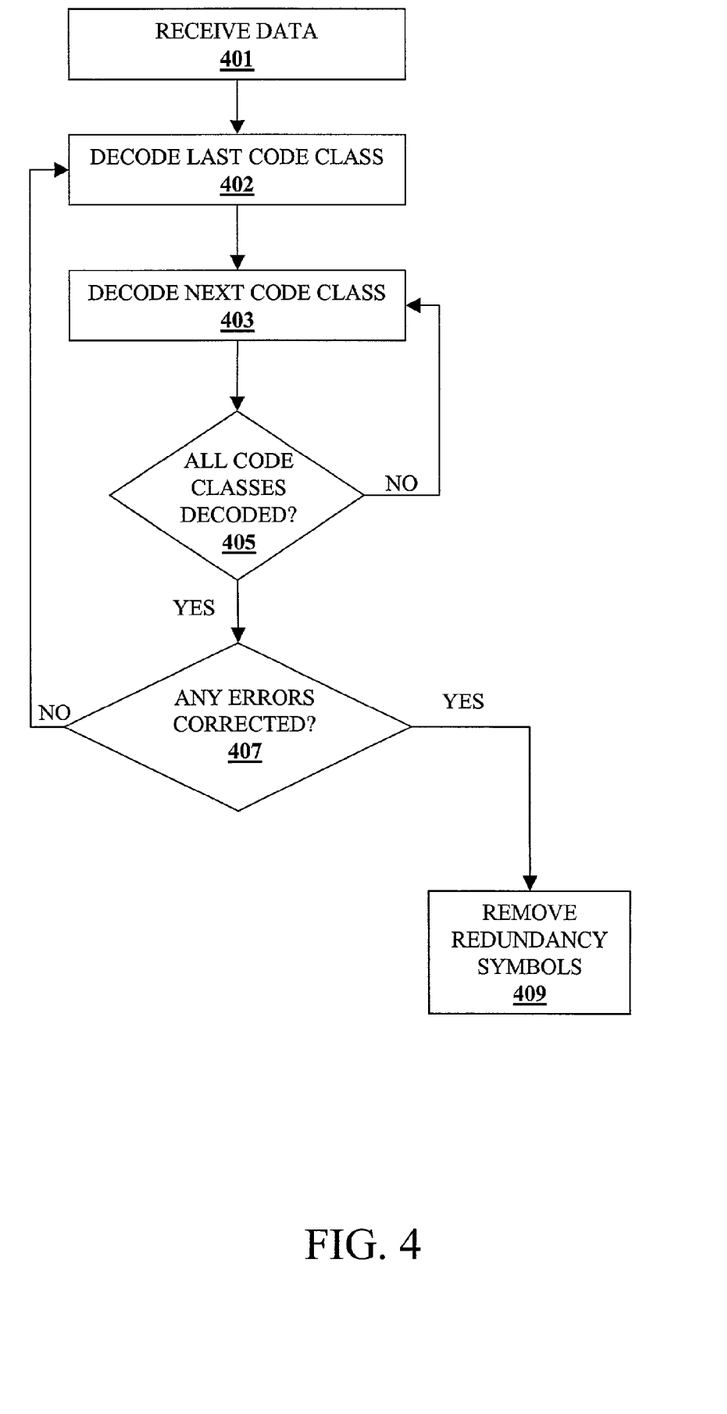
FIG. 4 is a flow chart for the decoding of data according to one embodiment of the invention.

FIG. 4 is a flow chart for the decoding of data according to one embodiment of the invention. At block 401 data is received. At block 402, the last code class (i.e., the last code class that was encoded at a transmitting network element) is processed. At block 403, the next code class (i.e., the code class encoded prior to the last code class at the transmitting network element) is processed. At block 405, it is determined if all of the code classes have been decoded. If all of the code classes have not been decoded, then control flows back to block 403. If all of the code classes have been decoded, then control flows to block 407.

At block 407 it is determined if any errors were corrected while processing all code classes. If any errors were corrected, then control flows from block 407 back to block 402. If no further errors were corrected, then at block 409 the redundancy symbols are removed from the received data.

FIG. 4 illustrates how interleaving multiple code classes enables iterative decoding to overcome the limitations of current FEC encoding schemes. For example, assume the encoding procedures 305 and 306 individually provide for correction of $t_1$ and $t_2$ transmission errors, respectively. If the number of errors in a code word of the first code class exceed $t_1$, then that code word typically could not be corrected. Since multiple code classes are interleaved and then iteratively decoded, corrected errors in the second code class possibly enable corrections in the first code class in a subsequent iteration. In other words, correction of an incorrect symbol that is at an intersection of code words of the first and second code class may reduce the number of errors in code word of the first code class below $t_1$. Thus this code word becomes correctable in the next iteration round.

As previously indicated, the order of operations illustrated in FIG. 4 is exemplary. For example, block 405 may not be performed because the number of code classes is known. Alternative embodiments of the invention may perform block 407 differently. Instead of observing performed error correction a fixed number of iterative cycles may be given. In addition, another embodiment of the invention may accept a certain level of error remaining in the outgoing data. In another embodiment of the invention, processing the single code classes (blocks 402 and 403) may be performed in parallel in the form of a pipelined architecture as illustrated in FIG. 5.

Figure 5:
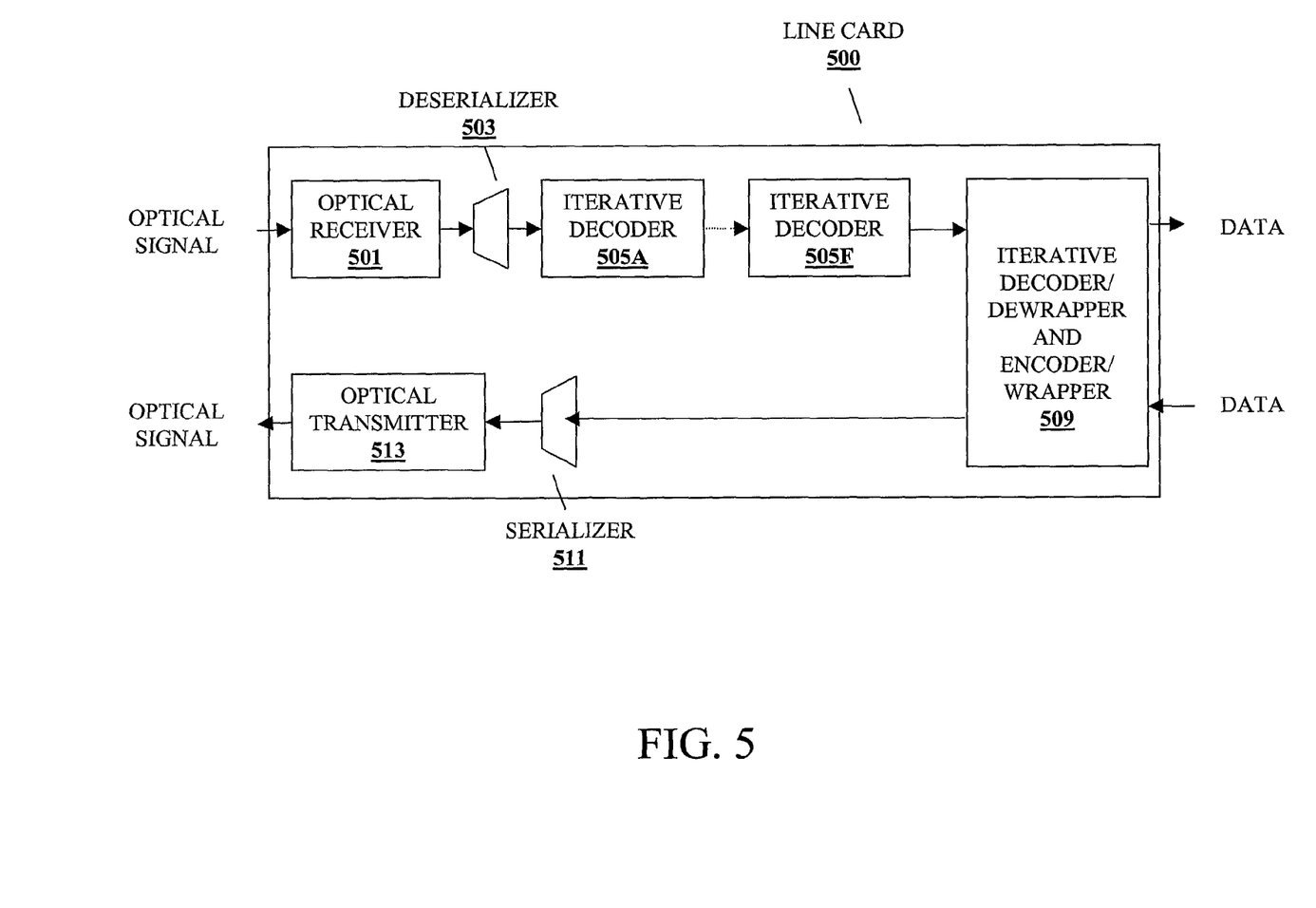
FIG. 5 is a diagram of components of a line card of a network element for according to one embodiment of the invention.

FIG. 5 is a diagram of components of a line card of a network element according to one embodiment of the invention. In FIG. 5, a line card 500 includes an optical receiver 501 receives wrapped data as an optical signal. The optical receiver 501 converts an optical signal into an electrical signal. The optical receiver 501 then passes wrapped data in electrical signal form to a deserializer 503. The deserializer 503 arranges the wrapped data for iterative decoding. The deserializer 503 then passes the wrapped data to be processed by a series of arbitrary number of iterative decoders 505A–505F. Each of the iterative decoders 505A–505F performs at least one iteration of decoding on all code classes of the wrapped data. The iterative decoder 505F passes the wrapped data to an iterative decoder/dewrapper and encoder/wrapper 509. The iterative decoder/dewrapper and encoder/wrapper 509 performs at least one more iteration of decoding all of the code classes of the data and dewraps the data. The iterative decoder/dewrapper and encoder/wrapper 509 then outputs the data.

The iterative decoder/dewrapper and encoder/wrapper 509 also receives data to be transmitted. The iterative decoder/dewrapper and encoder/wrapper 509 wraps the received data as described in FIG. 1A and encodes the received data as previously described in FIGS. 1–2. The iterative decoder/dewrapper and encoder/wrapper 509 then passes the wrapped and encoded data to a serializer 511. The serializer 511 arranges the wrapped data for transmission. The serializer 511 then passes the serialized wrapped data to an optical transmitter 513. The optical transmitter 513 converts the serialized wrapped data from an electrical signal to an optical signal and transmits the optical signal.

The line card 500 and/or the components of the line card 500 include one or more machine-readable media. A machine-readable medium includes any mechanism that provides (i.e., stores and/or transmits) information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

The embodiment of the invention illustrated in FIG. 5 is scalable by the number of iterative decoders coupled together. In addition, the illustrated embodiment of the invention provides substantial board space savings by implementing the encoder and the decoder as a single component. Various embodiments of the invention may implement the iterative decoders differently. For example, the iterative decoders 505A–505F may be implemented as a single iterative FEC decoder, the iterative decoders 505A–505F and the decoding function in the iterative decoder/dewrapper and encoder/wrapper unit 509 may be implemented as a single unit.

Figure 6A:
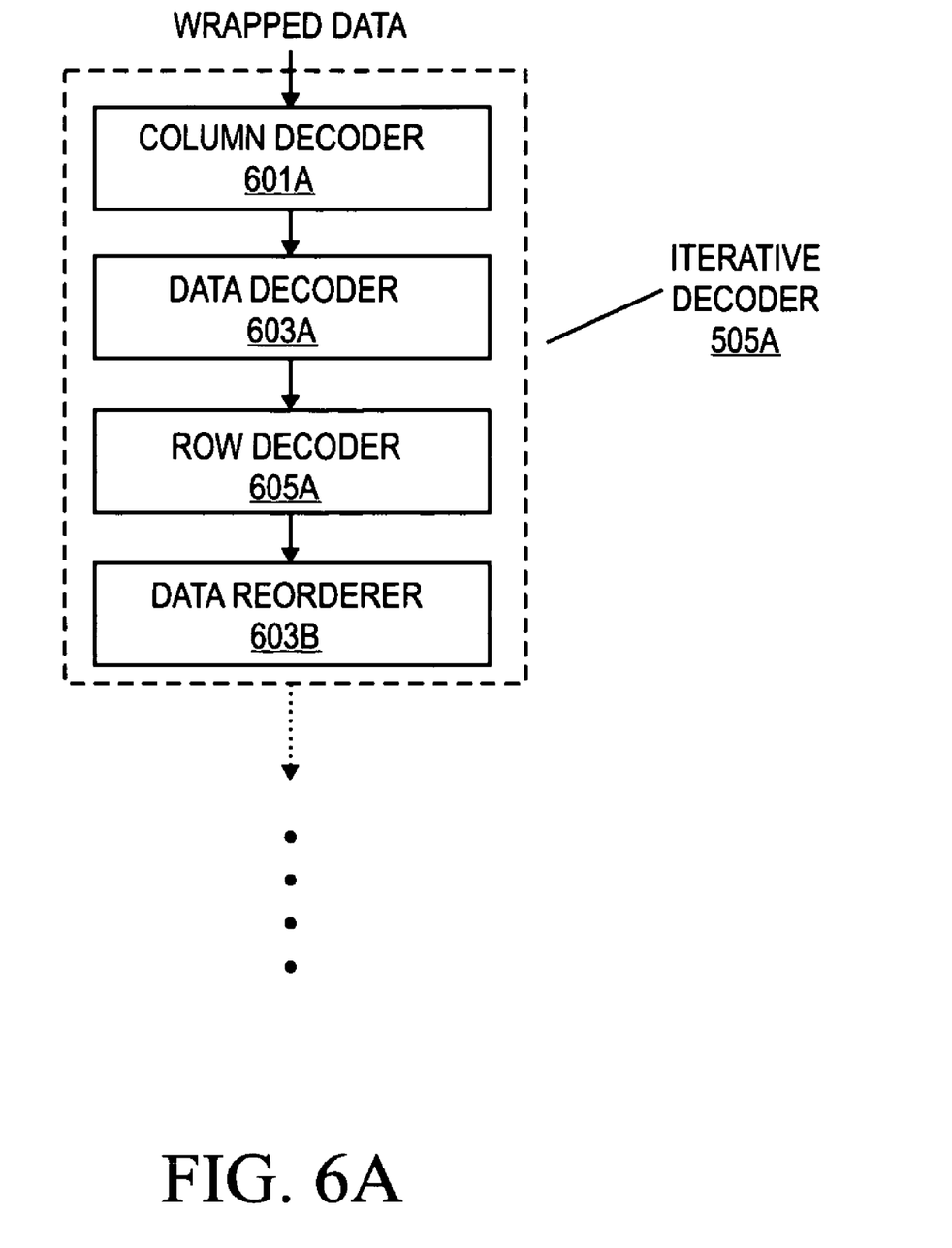
FIG. 6A is a diagram illustrating an exemplary embodiment of the invention of the iterative decoder 505A of FIG. 5 according to one embodiment of the invention.

FIG. 6A is a diagram illustrating an exemplary embodiment of the invention of the iterative decoder 505A of FIG. 5 according to one embodiment of the invention. In FIG. 6A, the iterative decoder 505A is for decoding two code classes. In FIG. 6A, a column decoder 601 of the iterative decoder 505A receives wrapped data. The column decoder 601 decodes each column of the received data. After decoding each column of the received data, the column decoder 601 passes the data to a data reorderer 603A. The data reorderer 603A rearranges the data received from the column decoder 601 from a column perspective to a row perspective. The data reorderer 603A then passes the reordered data to a row decoder 605. The row decoder 605 decodes the received data as rows of a matrix. The row decoder 605 then passes the data to a data reorderer 603B. The data reorderer 603B rearranges the data from the perspective of rows to columns. The data reorderer 603B then passes the reordered data to the next iterative decoder.

Figure 6B:
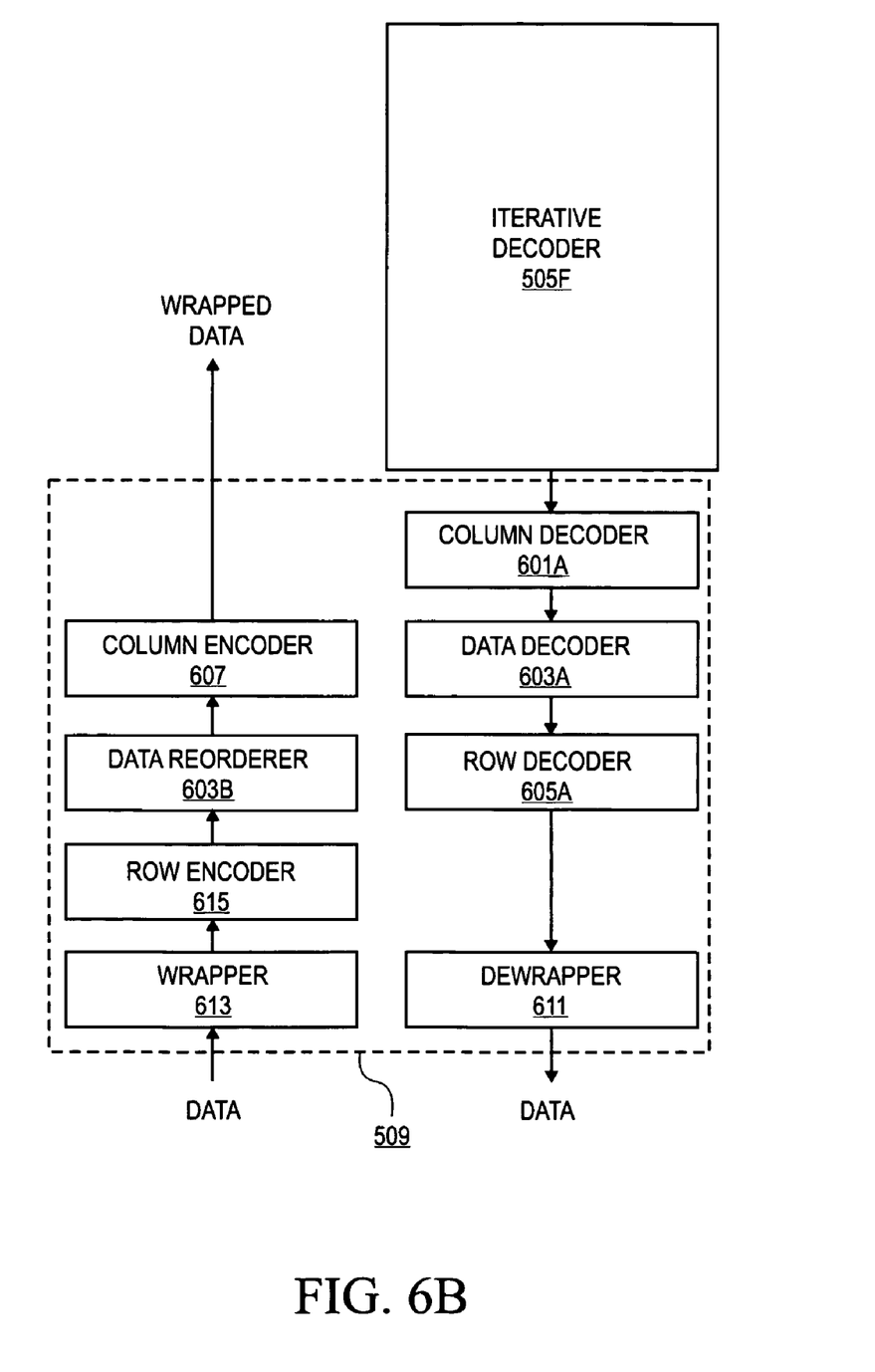
FIG. 6B is a diagram illustrating an exemplary embodiment of the invention of the iterative decoder/dewrapper and encoder/wrapper 509 according to one embodiment of the invention.

FIG. 6B is a diagram illustrating an exemplary embodiment of the invention of the iterative decoder/dewrapper and encoder/wrapper 509 according to one embodiment of the invention. In FIG. 6B, the iterative decoder 505F passes data to the iterative decoder/dewrapper and encoder/wrapper ("hybrid unit") 509. The data passes through the column decoder 601A, data reorderer 603A, and a row decoder 605A, similar to each of the iterative decoders 505A–505F. The row decoder 605A passes the data to the dewrapper 611. The dewrapper 611 dewraps the data similar to the dewrapping previously described in FIG. 1. The hybrid unit 509 also includes a wrapper 613. The wrapper 613 receives data to be transmitted and wraps the data similar to the wrapping previously described with respect to FIG. 1. The wrapper 613 passes the wrapped data to a row encoder 615. The row encoder 615 fills in some of the space added by the wrapper 613 with row redundancy symbols. The row encoder 615 then passes this data to a data reorderer 603B. The data reorderer 603B reorders the data from a row perspective to a column perspective. The data reorderer 603B then passes the reordered data to a column encoder 607. The column encoder 607 fills the rest of the space added by the wrapper 613 with column redundancy symbols. The column encoder 607 then passes the data out of the iterative decoder/dewrapper and encoder/wrapper 509.

Figure 7:
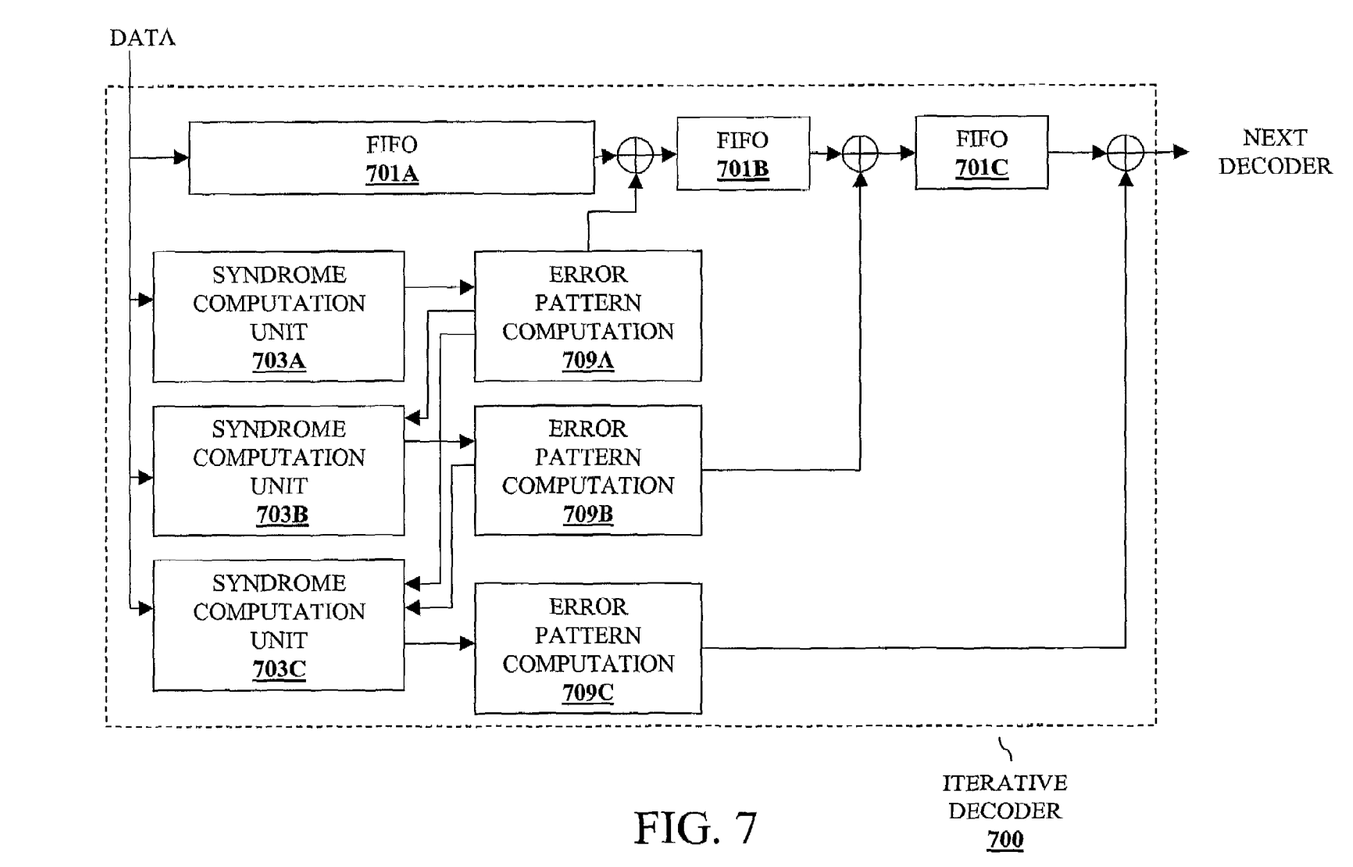
FIG. 7 is a diagram illustrating an iterative decoder with backward annotation according to one embodiment of the invention.

FIG. 7 is a diagram illustrating an iterative decoder with backward annotation according to one embodiment of the invention. The iterative decoder illustrated in FIG. 7 is an exemplary three code class iterative decoder. For simplicity it is assumed, that each code class is of algebraic nature comprising the computation for syndromes as a first step. An iterative decoder 700 illustrated in FIG. 7 includes syndrome computation units 703A–703C. Alternative embodiments of the invention may include more or less syndrome computation units. Error pattern computation units 709A–709C are coupled with the syndrome computation units 703A–703C. The iterative decoder 700 receives data having three code classes. The received data is stored in a FIFO 701A. The received data is also sent to the syndrome computation units 703A–703C.

The syndrome computation unit 703A computes the syndrome for the third code class. The syndrome computation unit 703A passes the syndrome to an error pattern computation unit 709A. The error pattern computation unit 709A calculates error patterns for error correction and also calculates a back annotation. The corrections determined by the error pattern computation unit 709A are applied to the data stored in the FIFO 701A. The resulting data is stored in a FIFO 701B. The calculated back annotation is passed from the error pattern computation unit 709A to the syndrome computation units 703B and 703C. Since syndrome computation is linear, the syndrome computation units 703A–703C compute their syndromes in parallel, hence the syndrome computation unit 703B has calculated a syndrome for the second code class. The syndrome computation unit 703B adds the received back annotation to its computed syndrome. The syndrome computation unit 703B then passes the syndrome with back annotation to the error pattern computation unit 709B. The error pattern computation unit 709B performs the same task as the error pattern computation unit 709A for the second code class.

The error pattern computation unit 709B applies the computed error correction information to the data stored in the FIFO 701B. The resulting data is stored in a FIFO 701C. The error pattern computation 709B passes the back annotation computed for the second code class to the syndrome computation unit 703C. The syndrome computation unit 703C should have computed a syndrome for the first code class and added the first code classes back annotation. The syndrome computation unit 703C then adds the back annotation for the second code class to its syndrome and passes the computed syndrome to the error pattern computation unit 709C. The error pattern computation unit 709C determines error correction information and applies the information to the data stored in the FIFO 701C. The resulting data is then passed to the next iterative decoder.

Iterative decoding of interleaved code classes with backward annotation reduces latency from decoding each code class. The error patterns of a code class $C_1$ may be computed immediately after error pattern computation of a code class $C_2$ has completed.

Figure 8:
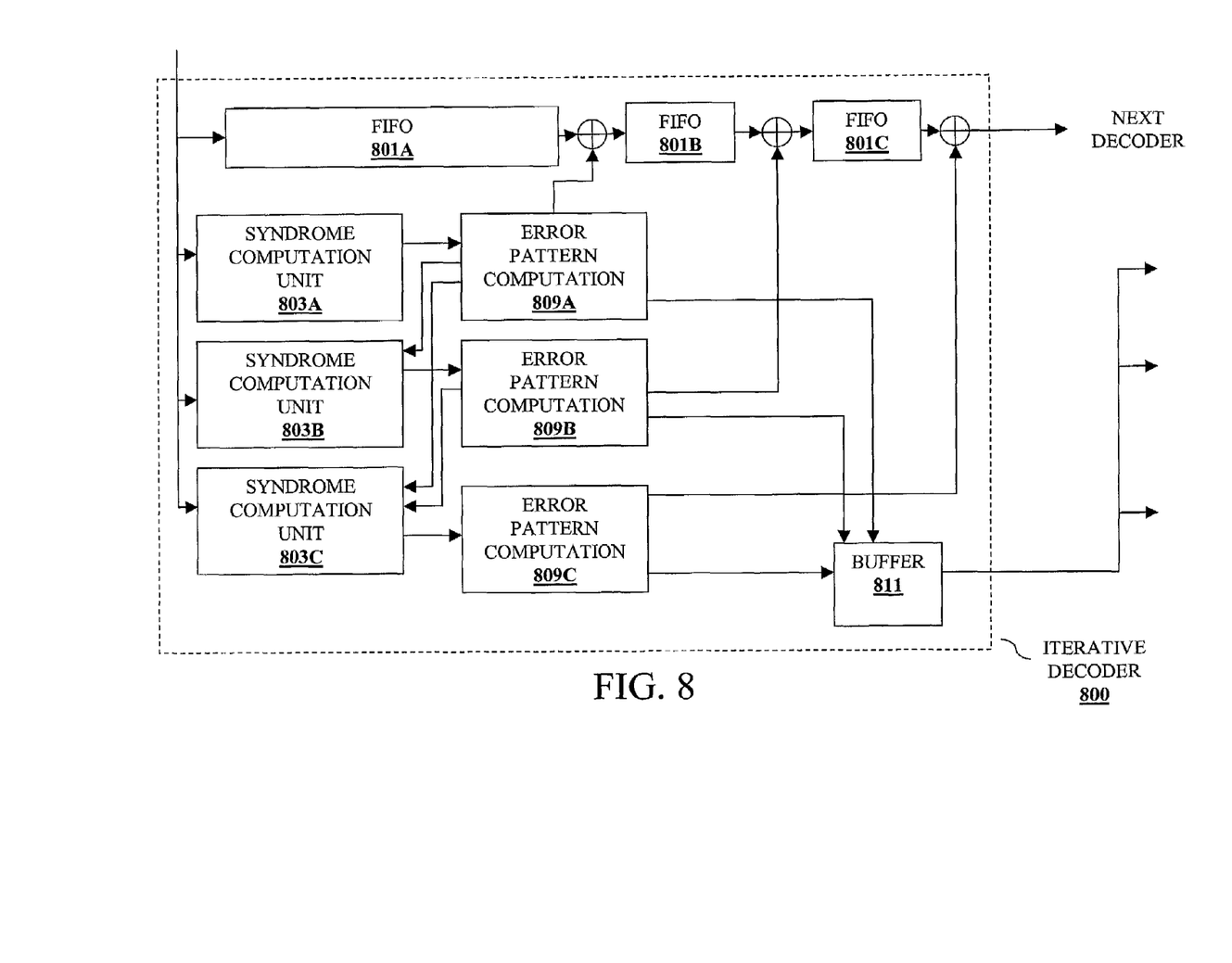
FIG. 8 is a diagram illustrating an iterative decoder with forward annotation according to one embodiment of the invention.

FIG. 8 is a diagram illustrating an iterative decoder with forward annotation according to one embodiment of the invention. An iterative decoder 800 illustrated in FIG. 8 is similar to the iterative decoder 700 illustrated in FIG. 7. The iterative decoder 800 includes syndrome computation units 803A–803C. Alternative embodiments of the invention may include more or less syndrome computation units. Error pattern computation units 809A–809C are coupled with the syndrome computation units 803A–803C. The iterative decoder 800 receives data having three code classes. The received data is stored in a FIFO 801A. The received data is also sent to the syndrome computation units 803A–803C.

The syndrome computation unit 803A computes the syndrome for the third code class. The syndrome computation unit 803A passes the syndrome to an error pattern computation unit 809A. The error pattern computation unit 809A calculates error patterns for error correction and also calculates a back annotation. The corrections determined by the error pattern computation unit 809A are applied to the data stored in the FIFO 801A. The resulting data is stored in a FIFO 801B. The calculated back annotation is passed from the error pattern computation unit 809A to the syndrome computation units 803B and 803C. Since syndrome computation is linear, the syndrome computation units 803A–803C compute their syndromes in parallel, hence the syndrome computation unit 803B has calculated a syndrome for the second code class. The error pattern computation unit 809A also stored its computed results in a buffer 811 for transmission to a syndrome computation unit of the next iterative decoder ("forward annotation"). The syndrome computation unit 803B adds the received back annotation to its computed syndrome. The syndrome computation unit 803B then passes the syndrome with back annotation to the error pattern computation unit 809B. The error pattern computation unit 809B performs the same task as the error pattern computation unit 809A for the second code class.

The error pattern computation unit 809B applies the computed error correction information to the data stored in the FIFO 801B. The resulting data is stored in a FIFO 801C. The error pattern computation 809B passes the back annotation computed for the second code class to the syndrome computation unit 803C and stores the computed error pattern in the buffer 811 for transmission to a syndrome computation unit of the next iterative decoder. The syndrome computation unit 803C should have computed a syndrome for the first code class and added the first code classes back annotation. The syndrome computation unit 803C then adds the back annotation for the second code class to its syndrome and passes the computed syndrome to the error pattern computation unit 809C. The error pattern computation unit 809C determines error correction information and applies the information to the data stored in the FIFO 801C. As with the error pattern computation units 809A–809B, the error pattern computation unit 809C passes its computed error pattern to the buffer 811 for transmission to a syndrome computation unit of the next iterative decoder. The data stored in the FIFO 801C passed to the next iterative decoder.

In one embodiment of the invention, the buffer 811 temporarily hosts computed annotations to be transmitted to the syndrome computation units of the next iterative decoder as indicated by the error pattern computation units. In alternative embodiments of the invention, error pattern computation units pass forward annotation information to a buffer specifically corresponding to the error pattern computation unit of an iterative decoder and a syndrome computation unit of the next iterative decoder. In another embodiment of the invention, error pattern computation units of an iterative decoder pass computed error patterns directly its corresponding syndrome computation unit of the next iterative decoder. Forward annotation reduces latency.

The described iterative decoding may be implemented by instructions stored on one or more machine-readable media. Thus, a machine-readable medium includes any mechanism that provides (i.e., stores and/or transmits) information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.), etc.

As previously described, iterative hard decision decoding of interleaved code classes enables forward error correction for optical transmissions.

While the invention has been described in terms of several embodiments of the invention, those skilled in the art will recognize that the invention is not limited to the embodiments of the invention described. The method and apparatus of the invention may be practiced with modification and alteration within the spirit and scope of the appended claims. The description is thus to be regarded as illustrative instead of limiting on the invention.

What is claimed is:

1. Art apparatus comprising:
a binary receiver to convert an optical signal to an electrical signal, the electrical signal having a set of information symbols and a set of redundancy symbols, the set of redundancy symbols generated by different forward error correction (FEC) encoding schemes; and
a first plurality of hard-decision decoders coupled with the binary receiver and the hard-decision decoders coupled together, each of the hard-decision decoders to iteratively decode the set of information symbols with the set of redundancy symbols in accordance with the different FEC encoding schemes,
wherein the plurality of decoders are to decode the symbols in accordance with the different FEC encoding schemes in parallel, and
wherein a hard-decision decoder of the plurality comprises:
a first syndrome computation unit to compute a first syndrome for a first code class of a set of hard-input data that has been optically received;
a second syndrome computation unit to compute a second syndrome for a second code class of the set, wherein the second code class is different than the first code class; and a first error pattern computation unit coupled with the first syndrome computation unit and with the second syndrome computation unit, the first error pattern computation unit to receive the first syndrome, to compute a first error pattern and a first back annotation, and to provide the first back annotation to the second syndrome computation unit.

2. The apparatus of claim 1, wherein the second syndrome computation unit is to add the back annotation to the second syndrome.

3. The apparatus of claim 1, wherein the first and second syndrome computation units are to compute the first and second syndromes in parallel.

4. The apparatus of claim 1, further comprising a buffer to store the first back annotation, wherein the buffer is coupled to provide the first back annotation to a syndrome computation unit of a decoder to subsequently perform decoding.

* * * * *

UNITED STATES PATENT AND TRADEMARK OFFICE
CERTIFICATE OF CORRECTION

PATENT NO. : 7,231,575 B2 Page 1 of 1
APPLICATION NO. : 10/113488
DATED : June 12, 2007
INVENTOR(S) : Kauschke et al.

It is certified that error appears in the above-identified patent and that said Letters Patent is hereby corrected as shown below:

In column 10, at line 2, claim 1 delete "Art" and insert --An--.

Signed and Sealed this

Twenty-first Day of April, 2009

JOHN DOLL
*Acting Director of the United States Patent and Trademark Office*